United States Patent
Strohmaier et al.

(10) Patent No.: US 11,811,192 B2
(45) Date of Patent: Nov. 7, 2023

(54) DIODE LASER ASSEMBLY AND METHOD FOR ASSEMBLING A DIODE LASER ASSEMBLY

(71) Applicant: TRUMPF Photonics, Inc., Cranbury, NJ (US)

(72) Inventors: Stephan Strohmaier, Berlin (DE); Arne-Heike Meissner-Schenk, Berlin (DE); Gerald Urban, Neuzelle (DE); Gerd Hansen, Berlin (DE); Christian Carstens, Stahnsdorf (DE)

(73) Assignee: TRUMPF Photonics, Inc., Cranbury, NJ (US)

( * ) Notice: Subject to any disclaimer, the term of this patent is extended or adjusted under 35 U.S.C. 154(b) by 387 days.

(21) Appl. No.: 17/254,612

(22) PCT Filed: Jun. 18, 2019

(86) PCT No.: PCT/EP2019/066004
§ 371 (c)(1),
(2) Date: Dec. 21, 2020

(87) PCT Pub. No.: WO2019/243323
PCT Pub. Date: Dec. 26, 2019

(65) Prior Publication Data
US 2021/0257807 A1    Aug. 19, 2021

(30) Foreign Application Priority Data

Jun. 21, 2018  (DE) .................... 10 2018 210 135.3

(51) Int. Cl.
*H01S 5/024*    (2006.01)

(52) U.S. Cl.
CPC .......... *H01S 5/024* (2013.01); *H01S 5/02415* (2013.01); *H01S 5/02469* (2013.01)

(58) Field of Classification Search
CPC ... H01S 5/024; H01S 5/02415; H01S 5/02469
See application file for complete search history.

(56) References Cited

U.S. PATENT DOCUMENTS 5,913,108 A    6/1999    Stephens et al.
6,352,873 B1    3/2002    Hoden
(Continued)

FOREIGN PATENT DOCUMENTS

| DE | 102008026801 A1 | 12/2009 | |
| DE | 102015002176 A1 | 8/2016 | |
| WO | WO-2017134923 A1 * | 8/2017 | ............ G02B 1/115 |

*Primary Examiner* — Tod T Van Roy
*Assistant Examiner* — Delma R Fordé
(74) *Attorney, Agent, or Firm* — Laurence A. Greenberg; Werner H. Stemer; Ralph E. Locher

(57) ABSTRACT

A diode laser arrangement includes a diode laser device, first and second cooling elements and at least one spacing device. The laser device and spacing device are mutually spaced apart between the first and second cooling elements. The laser device and the spacing device are disposed on respective first and second outer surfaces of respective cooling elements. The first and second cooling elements cool the laser device. The laser device has first and second diode main surfaces. The first diode main surface is on the first outer surface in a first front region and/or the second diode main surface is on the second outer surface in a second front region. The spacing device places the first outer surface in the first front region parallel to the first diode main surface, and/or the second outer surface in the second front region parallel to the second diode main surface.

14 Claims, 5 Drawing Sheets

(56) References Cited

U.S. PATENT DOCUMENTS

| | | |
|---|---|---|
| 8,649,405 B2 | 2/2014 | Schroeder et al. |
| 2008/0095204 A1 | 4/2008 | Miyajima et al. |
| 2008/0165500 A1* | 7/2008 | Yoshioka ............... H01S 5/024 |
| | | 361/699 |
| 2018/0138664 A1 | 5/2018 | Huelsewede et al. |
| 2021/0119413 A1* | 4/2021 | Strohmaier ......... H01S 5/02469 |

* cited by examiner

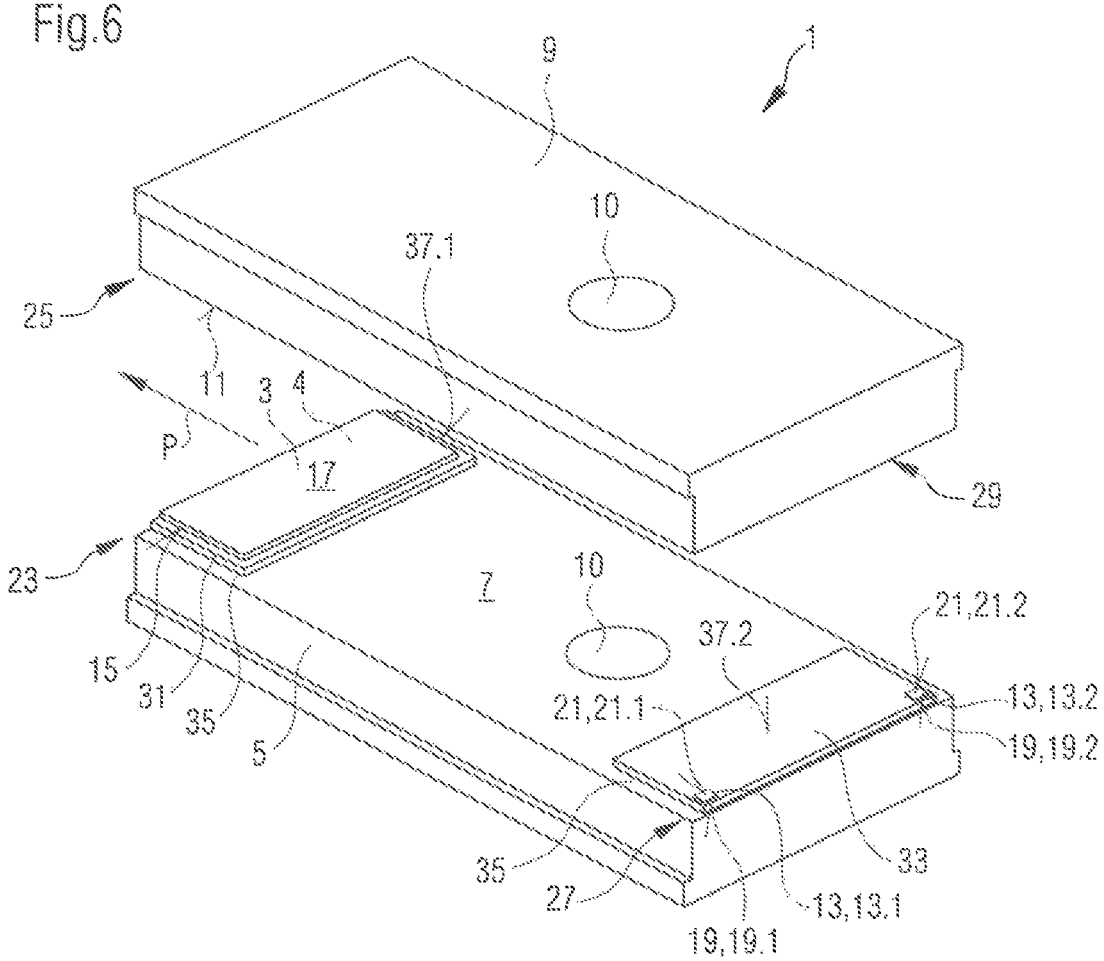
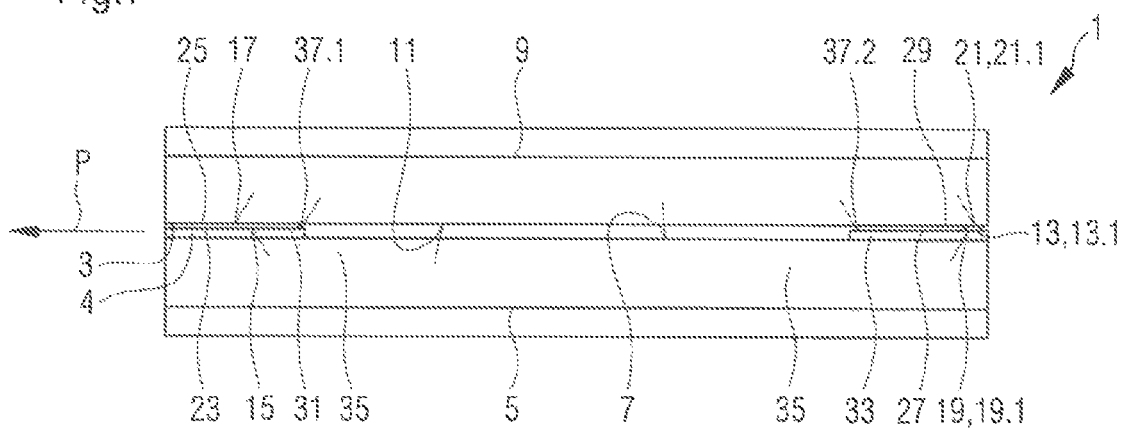

DIODE LASER ASSEMBLY AND METHOD FOR ASSEMBLING A DIODE LASER ASSEMBLY

BACKGROUND OF THE INVENTION

Field of the Invention

The invention relates to a diode laser arrangement and to a method for assembling a diode laser arrangement.

During the operation of a diode laser device with an emitter or multiple emitters, for example a diode laser bar, heat is generated which must be dissipated in order to attain a high output power with simultaneously long service life and high beam quality. For this purpose, cooling elements are known which are thermally connected to the diode laser device. In the case of a typical diode laser arrangement, provision is made for such a diode laser device to be arranged between two cooling elements of the type discussed, such that the two cooling elements are arranged in each case at two oppositely situated sides of the diode laser device.

In order that optimum heat transfer can take place at the two sides of the diode laser device, the diode laser device and the cooling elements must bear against one another in each case with as large an area as possible. In particular owing to accuracies, for example dimensional, shape or situation tolerances, which exist in the case of the components used, for example of the diode laser device or of the cooling elements, or joints between these components, contact of the diode laser device with the cooling elements over a large area without air gaps cannot be ensured. In particular, a plane-parallel arrangement of a diode main surface of the diode laser device with respect to an outer surface, situated opposite the diode main surface, of a cooling element cannot be ensured. Such deviations lead to inadequate heat transfer. Tolerance-induced gaps between the diode laser device and the two cooling elements are often filled with a solder layer which is generally thick at least in certain locations, but this cannot realize optimum heat transfer. Owing to the reduced heat transfer, the output power of the diode laser device is limited to a reduced level, which restricts the usability of the diode laser arrangement.

SUMMARY OF THE INVENTION

The invention is based on the object of creating a diode laser arrangement and a method for assembling a diode laser arrangement, wherein advantages are realized in relation to known diode laser arrangements in particular with regard to high output power with simultaneously long service life and high beam quality.

The object is achieved through the creation of the subjects of the independent claims. Advantageous refinements become apparent from the dependent claims.

The object is achieved in particular through the creation of a diode laser arrangement which has a diode laser device, a first cooling element, a second cooling element and at least one spacing device. The diode laser device is configured to emit a laser beam, which may also be composed of multiple partial laser beams. Here, the first cooling element has a first outer surface. Here, the second cooling element has a second outer surface. Here, the diode laser device and the at least one spacing device are arranged, spaced apart from one another, in each case between the first cooling element and the second cooling element. Here, the diode laser device and the at least one spacing device are arranged in each case on the first outer surface and on the second outer surface. Here, the first cooling element and the second cooling element are in each case configured to cool the diode laser device. Here, the diode laser device has a first diode main surface and a second diode main surface, wherein the diode laser device is arranged with the first diode main surface on the first outer surface in a first front region of the first outer surface. It is alternatively or additionally the case here that the diode laser device is arranged with the second diode main surface on the second outer surface in a second front region of the second outer surface. Here, the at least one spacing device is configured to set a situation of the first cooling element and of the second cooling element relative to one another such that the first outer surface is, in the first front region, arranged parallel to the first diode main surface. It is alternatively or additionally the case here that the at least one spacing device is configured to set the situation of the first cooling element and of the second cooling element relative to one another such that the second outer surface is, in the second front region, arranged parallel to the second diode main surface.

The diode laser arrangement according to the invention has advantages in relation to the prior art. By virtue of the fact that the diode laser device is arranged with the first diode main surface in the first front region of the first outer surface and/or with the second diode main surface in the second front region of the second outer surface, and the at least one spacing device is configured to set the situation of the first cooling element and of the second cooling element relative to one another such that the first outer surface is, in the first front region, arranged parallel to the first diode main surface and/or the second outer surface is, in the second front region, arranged parallel to the second diode main surface, contact of the diode laser device against the first and/or second cooling element over a large area, in particular over a full area, is ensured. This applies in particular even in the case of tolerance-induced dimensional, shape and situation deviations of the diode laser device, of the cooling elements and/or of joints on said components. In this way, it is possible to realize increased heat transfer between the diode laser device and the first cooling element and the second cooling element respectively.

It is thus possible for an output power of the diode laser device to be significantly increased, in particular by means of an increased current supply, wherein, at the same time, in particular a long service life and high beam quality of the diode laser device are ensured. Furthermore, a maximum temperature of the diode laser device during operation can be lowered. The beam quality of the diode laser device is improved in particular owing to a reduced temperature-induced shift of the wavelength during operation. In particular, safe and reliable operation of the diode laser arrangement with high output power is realized by means of the diode laser arrangement according to the invention.

The diode laser device preferably has at least one emitter, in particular single emitter. Such an emitter is preferably formed as an edge emitter. Such an emitter is preferably formed as a high-power emitter. The diode laser device particularly preferably has multiple emitters, wherein the diode laser device in particular has a diode laser bar with multiple emitters, which are preferably arranged in a one-dimensional row (array). Such a diode laser bar is preferably formed as an edge emitter. Such a diode laser bar is particularly preferably formed as a high-power diode laser bar. For example, the at least one emitter is fixedly connected to the first cooling element and/or to the second cooling element by soldering or some other suitable joining process.

In particular, the first diode main surface and the second diode main surface are arranged in each case on two oppositely situated sides of the diode laser device.

It is particularly preferable if the diode laser device lies with the first diode main a surface, in particular over a full area, against the first outer surface in the first front region of said first outer surface. Alternatively or in addition, the diode laser device lies with the second diode main surface, in particular over a full area, against the second outer surface in the second front region of said second outer surface.

In particular, the first cooling element and/or the second cooling element in each case have/has a heat sink. Preferably, the first cooling element and/or the second cooling element in each case have/has a much larger surface area than the diode laser device, in particular than the at least one emitter, such that an effective cooling action is realized.

In a preferred embodiment of the diode laser arrangement, the first cooling element and the second cooling element are in each case configured to electrically contact the diode laser device. It is in particular the case here that the first outer surface is electrically connected preferably in the first front region to a first pole, arranged in particular on the first diode main surface, of the diode laser device, and the second outer surface is electrically connected preferably in the second front region to a second pole, arranged in particular on the second diode main surface, of the diode laser device. Owing to the contact of the diode laser device against the first and second cooling elements preferably over a large area, it is advantageously possible to realize a uniform current distribution on the diode laser device, in particular on the at least one emitter.

In a preferred embodiment of the diode laser arrangement, the first outer surface and/or the second outer surface are/is in each case of substantially planar form. Preferably, the first outer surface and/or the second outer surface are/is in each case formed substantially as a rectangular surface.

In an alternative preferred embodiment of the diode laser arrangement, the first cooling element and/or the second cooling element in each case have/has at least one intermediate element. Such an intermediate element is in particular of plate-like form. In particular, such an intermediate element is formed as a submount. In particular, the first outer surface and/or the second outer surface then have/has in each case multiple surface sections arranged in a stepped manner relative to one another. In particular, such an intermediate element is assigned one surface section of the outer surface of the cooling element assigned to said intermediate element, which surface section is of elevated form in relation to one or more further surface sections of said outer surface. Preferably, the multiple surface sections of the first and/or of the second outer surface lie in each case parallel to one another.

In a preferred embodiment of the diode laser arrangement, the diode laser device is arranged on a front intermediate element or between two front intermediate elements. Alternatively or in addition, the at least one spacing device is arranged on a rear intermediate element or between two rear intermediate elements.

Preferably, a front intermediate element of said type is of identical form, at least with regard to its thickness, to a rear intermediate element of said type. In this way, it is advantageously possible in each case for a spacing of the first cooling element and of the second cooling element relative to one another to be changed to an equal extent.

Such a front intermediate element is preferably formed as a heat distributor for improving the heat transfer between the diode laser device and a heat sink of the first and/or of the second cooling element.

In particular, such a front or rear intermediate element is fixedly connected by means of soldering, adhesive bonding or some other suitable joining process to a remaining part of the cooling element assigned to the respective intermediate element.

In particular, the first outer surface and the second outer surface are situated opposite one another, wherein they delimit an intermediate space between the first cooling element and the second cooling element. In particular, the diode laser device and the at least one spacing device are arranged in said intermediate space.

Preferably, the diode laser device, in particular the at least one emitter, is thermally coupled to the first cooling element and to the second cooling element, wherein heat transfer takes place in particular between the first diode main surface and the first front region of the first outer surface and between the second diode main surface and the second front region of the second outer surface, in particular during operation of the diode laser arrangement.

The first diode main surface and/or the second diode main surface are/is in particular in each case of rectangular form. Preferably, the first diode main surface and/or the second diode main surface are/is substantially in each case of planar form. In particular, the first front region of the first outer surface and the second front region of the second outer surface are in each case of planar form.

The diode laser device is preferably fixedly, in particular rigidly and/or permanently, connected, by means of a suitable joining process, by way of the first diode main surface to the first cooling element via the first outer surface and/or by way of the second diode main surface to the second cooling element via the second outer surface. Such a joining process may for example be soldering, sintering, adhesive bonding or some other process. In particular, such a connection extends over a region in which the first diode main surface and the first outer surface and/or the second diode main surface and the second outer surface lie against one another.

It is preferably the case that the diode laser device, with the first diode main surface, and the first cooling element, with the first outer surface, lie against one another without a gap in the first front region. Alternatively or in addition, it is preferably the case that the diode laser device, with the second diode main surface, and the second cooling element, with the second outer surface, lie against one another without a gap in the second front region.

Preferably, the at least one spacing device is configured to set a spacing between the first outer surface and the second outer surface, in particular in the region of the spacing device. In particular, the situation of the first cooling element and of the second cooling element relative to one another is set through the setting of said spacing. In a preferred embodiment of the diode laser arrangement, multiple spacing devices are provided, which are in each case configured to set identical and/or mutually different spacings of the type discussed.

In particular, the at least one spacing device is configured to set a situation of the first outer surface, in particular in the first front region, and a situation of the second outer surface, in particular in the second front region, relative to one another.

An embodiment of the diode laser arrangement is preferred which is distinguished by the fact that the first outer surface and the second outer surface, at least in certain regions, in particular in the first and the second front region, and/or in a first rear region situated opposite the first front region and a second rear region situated opposite the second front region, are arranged parallel to one another and/or are formed so as to be in each case plane-parallel. Such an arrangement is particularly straightforward and inexpensive to produce.

An embodiment of the diode laser arrangement is preferred which is distinguished by the fact that the at least one spacing device has a first contact surface, which is arranged on the first outer surface, and a second contact surface, which is arranged on the second outer surface. Here, the first contact surface or the second contact surface, preferably the first contact surface and the second contact surface, are/is in each case smaller than the first diode main surface or the second diode main surface, preferably the first diode main surface and the second diode main surface. It is preferable here if the first contact surface or the second contact surface, preferably the first contact surface and the second contact surface, are/is in each case smaller than $1/10$ of the first diode main surface or $1/10$ of the second diode main surface, preferably $1/10$ of the first diode main surface and $1/10$ of the second diode main surface. For example, the first and the second diode main surface may in each case be 40 mm², wherein the first contact surface and/or the second contact surface are/is in each case preferably less than 4 mm².

Preferably, the first contact surface and/or the second contact surface are of rectangular form. Alternatively, the first contact surface and/or the second contact surface may be formed as, in particular three-dimensional, free-form surfaces. By means of dimensioning of the described type, the situation of the first cooling element and of the second cooling element relative to one another can be set particularly reliably and accurately by means of the at least one spacing device. For example, in the case of assembly-induced erroneous tilting of the at least one spacing device relative to the first and/or second cooling element, an erroneous change in the situation is significantly reduced or even substantially prevented.

An embodiment of the diode laser arrangement is preferred which is distinguished by the fact that the first contact surface or the second contact surface, preferably the first contact surface and the second contact surface, is/are in each case larger than $1/300$ of the first diode main surface or $1/300$ of the second diode main surface, preferably $1/300$ of the first diode main surface and $1/300$ of the second diode main surface. In the case of an exemplary size of the first and of the second diode main surface of 40 mm², the first contact surface and/or the second contact surface are/is in each case preferably larger than 0.133 mm².

Preferably, the first contact surface or the second contact surface, preferably the first contact surface and the second contact surface, is/are in each case larger than $1/30$ of the first diode main surface or $1/30$ of the second diode main surface, preferably $1/30$ of the first diode main surface and $1/30$ of the second diode main surface. In the case of an exemplary size of the first and of the second diode main surface of 40 mm², the first contact surface and/or the second contact surface are/is in each case preferably larger than 1.33 mm². By means of such dimensioning, the situation of the first cooling element and of the second cooling element relative to one another can be set particularly reliably and accurately. In this way, an undesired ingress of the at least one spacing device into the first and/or the second outer surface owing to an excessively high contact pressure can be prevented.

An embodiment of the diode laser arrangement is preferred which is distinguished by the fact that the at least one spacing device is assigned a stack with at least one spacer element, preferably with multiple spacer elements, for setting the situation of the first cooling element and of the second cooling element relative to one another. In particular, the at least one spacing device is firmly assigned the stack with the at least one spacer element after initial assembly of the diode laser arrangement. Here, the at least one spacer element is preferably selected from a group composed of multiple at least partially differently dimensioned spacer elements. Preferably, the multiple spacer elements in the group are dimensioned differently in each case with regard to their thickness.

In particular, the spacing between the first outer surface and the second outer surface is, at least in the region of the at least one spacing device, dependent on a thickness of the at least one spacer element. Preferably, the multiple spacer elements in the group are dimensioned differently with regard to their respective thickness, preferably in a stepped manner, such that, through the use of a suitable single spacer element or through a combination of multiple suitable spacer elements, it is possible to set a multiplicity of different spacings between the first and the second outer surface in the region of the at least one spacing device. The at least one spacer element is formed in particular as a small plate, washer or shim.

In a preferred embodiment of the diode laser arrangement, the stack has multiple spacer elements of the type discussed. Said spacer elements are preferably in each case differently dimensioned, in particular with regard to their thickness. In particular, the spacing between the first outer surface and the second outer surface is, at least in the region of the at least one spacing device, dependent on a cumulative thickness of the multiple spacer elements.

In a preferred embodiment of the diode laser arrangement, the at least one spacing device is formed as a single piece, in particular as a single spacer element.

It is possible that the at least one spacer element is formed as a diode laser bar, which is preferably arranged in the reverse direction, such that electrical insulation between the first and the second cooling element is realized. By means of the stack or stacks with in each case at least one spacer element, it is possible in a straightforward manner to perform reliable and precise setting of the spacing between the two cooling elements, in particular the situation of said cooling elements relative to one another.

An embodiment of the diode laser arrangement is preferred which is distinguished by the fact that the at least one spacing device has at least one wedge-shaped spacer element which is displaceable relative to the first cooling element or the second cooling element, preferably between the first cooling element and the second cooling element. In particular, the at least one wedge-shaped spacer element is slidable between the first and the second outer surface, in particular in the first and the second rear region of the first and of the second outer surface respectively, wherein the spacing between the first and the second outer surface, in particular the situation of the first and of the second cooling element relative to one another, is set in a manner dependent on the extent to which the at least one wedge-shaped spacer element is slid between the first and the second outer surface and thus the first and the second cooling element are pushed apart. In particular, the at least one wedge-shaped spacer element, in a position in which the situation of the first and of the second cooling element relative to one another has been set as intended, is fixedly, preferably rigidly and/or permanently, held relative to the first and/or the second cooling element. Such a fixed connection is realized by means of a suitable joining process, for example adhesive bonding, soldering or sintering.

The at least one spacing device particularly preferably has two such wedge-shaped spacer elements, which in particular lie mirror-symmetrically one above the other. These two wedge-shaped spacer elements are in particular displaceable relative to one another, in particular slidable one over the other, in mutually opposite directions. Preferably, the at least one spacing device has two or more than two such pairs of wedge-shaped spacer elements. Preferably, by means of one or more such wedge-shaped spacer elements, the situation of the two cooling elements relative to one another can be set in continuously variable fashion during initial assembly of the diode laser arrangement, wherein said situation is in particular fixedly set in the assembled diode laser arrangement.

An embodiment of the diode laser arrangement is preferred which is distinguished by the fact that the at least one spacing device has a spacer element which is of oval form as viewed in cross section, wherein the situation of the first cooling element and of the second cooling element relative to one another can be set by rotation of the spacer element of oval form, in particular relative to the first cooling element and/or to the second cooling element. By rotation of the spacer element of oval form, the first cooling element and the second cooling element can be pushed apart owing to the oval form. In particular, the spacer element of oval form, in a position in which the situation of the two cooling elements relative to one another has been set as intended, is fixedly, preferably rigidly and/or permanently, held relative to the first and/or the second cooling element. Preferably, by means of the spacer element of oval form, the situation of the two cooling elements relative to one another can be set in continuously variable fashion during initial assembly of the diode laser arrangement, wherein said situation is in particular fixedly set in the assembled diode laser arrangement.

An embodiment of the diode laser arrangement is preferred which is distinguished by the fact that the at least one spacing device is at least partially of plastically deformable form. The at least one spacing device particularly preferably has at least one plastically deformable spacer element. During and/or before initial assembly of the diode laser arrangement, the at least one spacing device and/or the at least one plastically deformable spacer element is deformed, in particular by action of force, such that the intended situation of the first and of the second cooling element relative to one another is set. In particular, the at least one spacing device and/or the at least one plastically deformable spacer element maintains a dimension realized by means of plastic deformation, or a shape realized in this way, during the operation of the diode laser arrangement. This type of setting is particularly straightforward and inexpensive.

An embodiment of the diode laser arrangement is preferred which is distinguished by the fact that the first cooling element, in a region situated opposite the first contact surface, and/or the second cooling element, in a region situated opposite the second contact surface, are/is of plastically deformable form. In particular, the at least one spacing device has at least one spacer element which has the first and/or the second contact surface and which is formed in a suitable manner, preferably so as to be rounded, spherical or pointed at least in certain regions, wherein said at least one spacer element can, during initial assembly of the diode laser arrangement, be pressed at least in certain sections into the first cooling element and/or the second cooling element. In particular, in the case of an embodiment of the first and/or of the second cooling element as a microchannel cooler, suitable regions are provided thereon, into which the at least one spacer element can be pressed without functional impairment of the microchannel cooler, such as for example leakage, occurring.

In particular, the first and/or the second contact surface areis formed in a suitable manner, preferably so as to be rounded, spherical or pointed at least in certain regions. In particular, the first outer surface and/or the second outer surface then, after initial assembly, in each case have/has a preferably local deformation into which the at least one spacer element is embedded at least in certain sections. In particular, the first and/or the second contact surface may in each case be formed as a three-dimensional free-form surface. It is however also possible for the first and/or the second contact surface to be of planar form. In this way, the situation of the two cooling elements relative to one another can be set in a straightforward and reliable manner.

Preferably, by means of a spacer element or multiple spacer elements of the type discussed, it is possible for a spacing between the first outer surface and the second outer surface to be set which is somewhat smaller than an intended spacing. It is preferably then provided that, during initial assembly of the diode laser arrangement, a thickness of the spacer element of the multiple spacer elements that is lacking in order to attain the intended spacing is realized by application of a filler material, in particular solder or adhesive, to the spacer element or to the multiple spacer elements. In particular, the at least one spacing device then has a filler material layer, preferably a solder or adhesive layer. By means of the filler material, it is also possible to realize a fastening of the spacer element or of the multiple spacer elements to the first cooling element and/or to the second cooling element, or of the multiple spacer elements to one another. It is thus possible in a straightforward manner to perform an adaptation of the situation between the two cooling elements relative to one another.

An embodiment of the diode laser arrangement is preferred which is distinguished by the fact that the situation of the first cooling element and of the second cooling element relative to one another, set by means of the at least one spacing device, is fixedly, preferably rigidly and/or permanently, set after initial assembly of the diode laser arrangement. The initial assembly is in particular assembly of the diode laser arrangement prior to the commencement of operation thereof. In particular, after the initial assembly, a spacer element or multiple spacer elements of the type discussed is/are fixed relative to one another and/or with respect to the first cooling element and/or the second cooling element such that the situation of the first cooling element and of the second cooling element relative to one another is fixedly set. For this purpose, use is made in particular of a suitable joining process. Preferably, the spacer element or the multiple spacer elements is/are connected in positively locking and/or cohesive fashion to one another and/or to the first cooling element and/or the second cooling element. In this way, an arrangement of the first and of the second cooling element in a fixed situation during the operation of the diode laser arrangement, in particular of the diode laser device, is ensured.

A suitable joining process of the type discussed is in particular adhesive bonding. Preferably, the at least one spacing device, in particular the spacer element or the multiple spacer elements of the type discussed, is fixedly connected to the first and/or to the second cooling element by means of adhesive bonding. Such an adhesive preferably has ceramic filler constituents. Such an adhesive is advantageously electrically insulating. By means of the ceramic filler constituents, a thermal conductivity can be improved, and a coefficient of thermal expansion can be set. In particular, the at least one spacing device, preferably also adjoining regions of the first and/or of the second cooling element, may be encased at least in certain sections by means of the adhesive. In this way, the situation of the first and of the second cooling element relative to one another can be securely fixed.

An embodiment of the diode laser arrangement is preferred which is distinguished by the fact that the at least one spacing device is configured to provide electrical insulation between the first cooling element and the second cooling element. By means of the electrical insulation, a short circuit during the operation of the cooling device can be effectively prevented, if the diode laser device is supplied with electrical current via the first and the second cooling element.

Alternatively or in addition, the at least one spacing device is configured to absorb pressure forces transmitted via the first cooling element or the second cooling element, preferably the first cooling element and the second cooling element, and/or in particular to transmit such pressure forces to the respectively other cooling element.

In particular, it is provided that a force flow between the first and the second cooling element runs substantially or entirely via the at least one spacing device. Here, the diode laser device is preferably substantially or entirely relieved of pressure forces which are introduced in particular from the outside via the first cooling element and/or the second cooling element into the diode laser arrangement, such that damage to the diode laser device by pressure forces that exceed an admissible limit can be reliably prevented.

In particular, it is provided that pressure forces acting between the first and the second cooling element are distributed in a predetermined ratio between the at least one spacing device and the diode laser device. Such pressure forces are particularly preferably distributed uniformly, in particular areally, in particular in the region of the first and second diode main surface. This is particularly advantageous for the beam characteristics of the at least one emitter of the diode laser device, in particular because a plastic deformation of the diode laser device can be substantially or entirely prevented.

An embodiment of the diode laser arrangement is preferred which is distinguished by the fact that the at least one spacing device is arranged on the first outer surface in the first rear region, situated opposite the first front region, of said first outer surface and is arranged on the second outer surface in the second rear region, situated opposite the second front region, of said second outer surface.

In particular, the diode laser device is arranged on the first outer surface close to an edge or at an edge thereof and/or on the second outer surface close to an edge or at an edge thereof. In particular, the at least one spacing device is arranged, in particular with the first contact surface, on the first outer surface, preferably in a flush manner, close to an edge or at an edge thereof. In particular, the at least one spacing device is arranged, in particular with the second contact surface, on the second outer surface, preferably in a flush manner, close to an edge or at an edge thereof. In this way, a precise orientation and reliable arrangement of the first and of the second cooling element is possible.

An embodiment of the diode laser arrangement is preferred which is distinguished by the fact that the diode laser arrangement has exactly one spacing device of the type discussed. Preferably, the exactly one spacing device is arranged centrally with respect to the diode laser device and/or on an axis of symmetry of the diode laser device. In particular, the exactly one spacing device is arranged in a centered manner with respect to an extent of the diode laser device, for example of a diode laser bar thereof, along a longitudinal axis of the diode laser device, which longitudinal axis runs perpendicular to a laser radiation direction of the diode laser device. In this way, the first and the second diode main surface form a base, and the first and the second contact surface of the exactly one spacing device form a vertex, situated opposite the base, of an isosceles triangle. In this way, particularly uniform support of the first and of the second cooling element on the diode laser device is realized.

An embodiment of the diode laser arrangement is preferred which is distinguished by the fact that the diode laser arrangement has two spacing devices of the type discussed, which are arranged spaced apart from one another. For the intended spacing of the first cooling element and of the second cooling element, it is the case in particular that a first of the two spacing devices and a second of the two spacing devices is used in each case—in particular in a manner dependent on a height of the diode laser device and/or on a situation of the first diode main surface relative to the second diode main surface—to set an equal or a mutually different spacing of the first and of the second outer surface in each case in the region of the first and of the second spacing device. Here, a height of the diode laser device of the type discussed describes in particular an extent of the diode laser device perpendicular to the first outer surface and/or the second outer surface.

Preferably, the first spacing device and the second spacing device are arranged adjacent to one another. The first spacing device and the second spacing device are particularly preferably arranged on the same side of the longitudinal axis of the diode laser device. Preferably, the first spacing device and the second spacing device have in each case the same spacing from the diode laser device. In this way, it is possible to realize an effective adaptation of the situation of the first and of the second outer surface relative to one another.

The object is in particular also achieved through the creation of a method for assembling a diode laser arrangement. It is particularly preferable that, in the course of the method, a diode laser arrangement according to one of the embodiments described above is produced. In the course of the method, a diode laser device and at least one spacing device are arranged spaced apart from one another in each case between a first cooling element, which is configured for cooling the diode laser device, and a second cooling element, which is configured for cooling the diode laser device. Here, the diode laser device and the at least one spacing device are arranged in each case on a first outer surface of the first cooling element and on a second outer surface of the second cooling element. In the method according to the invention, the diode laser device is arranged with a first diode main surface on the first outer surface in a first front region thereof or with a second diode main surface on the second outer surface in a second front region thereof, preferably with the first diode main surface on the first outer surface in the first front region thereof and with the second diode main surface on the second outer surface in the second front region thereof. Here, by means of the at least one spacing device, a situation of the first cooling element and of the second cooling element relative to one another is set such that the first outer surface is, in the first front region, arranged parallel to the first diode main surface, wherein, alternatively or in addition, the second outer surface is, in the second front region, arranged parallel to the second diode main surface. In particular, the advantages that have already been discussed in conjunction with the diode laser arrangement are obtained in the context of the method.

Optionally, the situation of the first cooling element and of the second cooling element relative to one another, set by means of the at least one spacing device, is fixedly set after initial assembly of the diode laser arrangement.

The description of the diode laser arrangement, on the one hand, and of the method for assembling a diode laser arrangement, on the other hand, are to be understood as complementary to one another. Features of the diode laser arrangement that have been discussed explicitly or implicitly in conjunction with the method are preferably, individually or in combination with one another, features of a preferred embodiment of the diode laser arrangement. Method steps that have been discussed explicitly or implicitly in conjunction with the diode laser arrangement are preferably, individually or in combination with one another, steps of a preferred embodiment of the method. Said method is preferably distinguished by at least one method step which is necessitated by at least one feature of an embodiment according to the invention, or preferred embodiment, of the diode laser arrangement. The diode laser arrangement is preferably distinguished by at least one feature which is necessitated by at least one step of an embodiment according to the invention, or preferred embodiment, of the method.

The invention will be discussed in more detail below on the basis of the drawing.

BRIEF DESCRIPTION OF THE SEVERAL VIEWS OF THE DRAWING

FIG. 6 is a schematic exploded illustration of a third exemplary embodiment of the diode laser arrangement in an oblique view, FIG. 7 is a schematic illustration of the diode laser arrangement as per FIG. 6 in a side view.

DETAILED DESCRIPTION OF THE INVENTION

Figure 1:
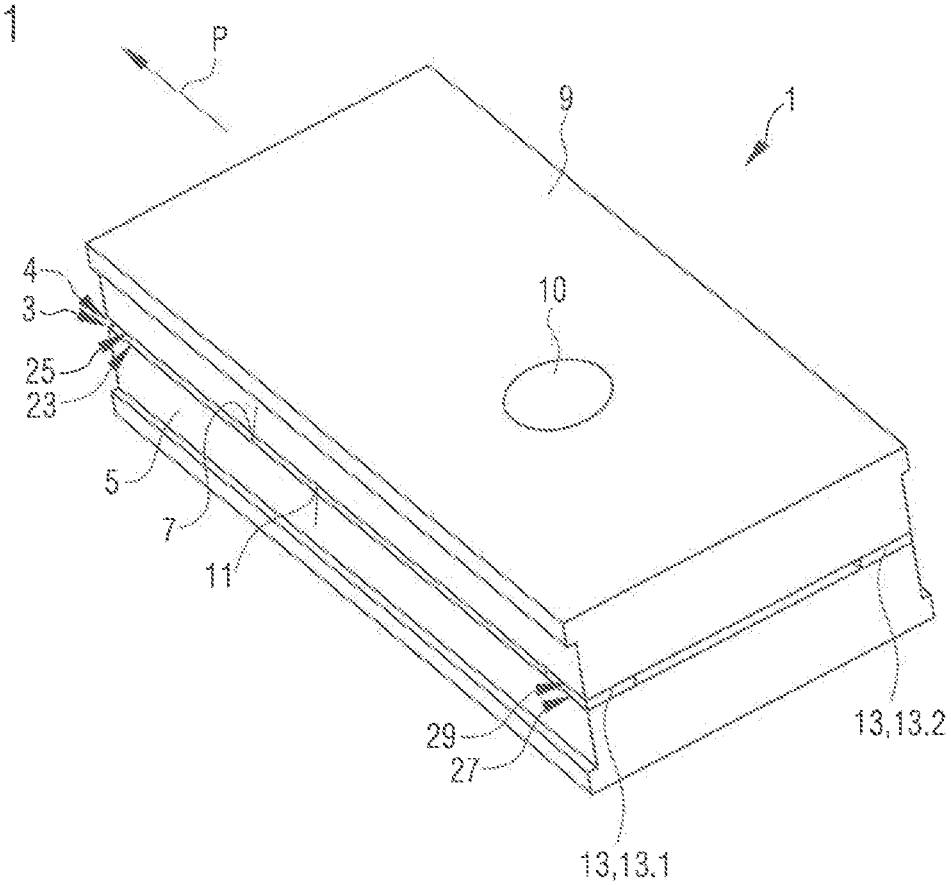
FIG. 1 is a schematic illustration of a first exemplary embodiment of a diode laser arrangement in an oblique view.

FIG. 1 schematically shows a first exemplary embodiment of a diode laser arrangement 1 in an oblique view. The diode laser arrangement 1 has a diode laser device 3, which in FIG. 1 is concealed and is therefore merely indicated by means of the corresponding reference designation. Here, the diode laser device 3 has a diode laser bar 4, wherein a laser radiation direction is schematically indicated by the arrow P. The diode laser arrangement 1 furthermore has a first cooling element 5. The first cooling element 5 has a first outer surface 7, which in this case is for the most part concealed by a second cooling element 9 of the diode laser arrangement 1. The second cooling element 9 has a bore 10, which may perform various functions which are not specified in any more detail here.

The second cooling element 9 has a second outer surface 11 which—from the viewer's point of view—is arranged on a bottom side of the second cooling element 9. The diode laser arrangement 1 has at least one spacing device 13, wherein, in the exemplary embodiment illustrated in FIG. 1, two spacing devices 13 are provided. Here, the diode laser arrangement 1 has a first spacing device 13.1 and a second spacing device 13.2. The first spacing device 13.1 and the second spacing device 13.2 are arranged spaced apart from one another.

The diode laser device 3 and the at least one spacing device 13, in this case the first spacing device 13.1 and the second spacing device 13.2, are arranged spaced apart from one another in each case between the first cooling element 5 and the second cooling element 9. The diode laser device 3 and the at least one spacing device 13, in this case the first spacing device 13.1 and the second spacing device 13.2, are arranged in each case on the first outer surface 7 and on the second outer surface 11.

The first cooling element 5 and the second cooling element 9 are in each case configured to cool the diode laser device 3.

Figure 2:
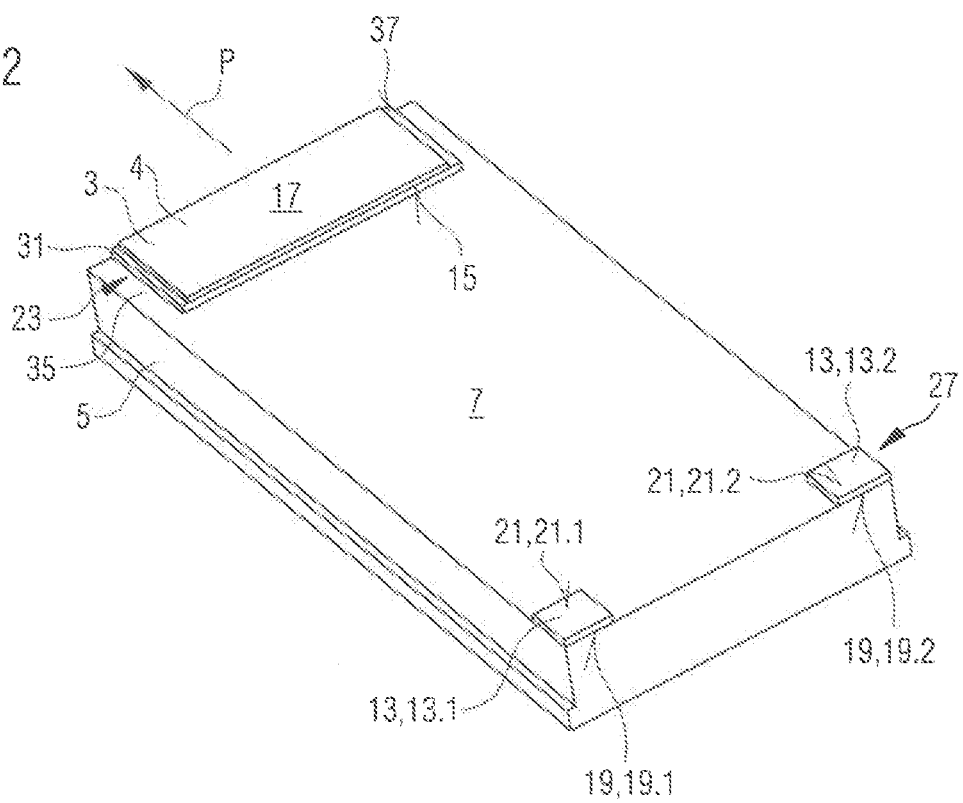
FIG. 2 is a schematic illustration of a first cooling element, of a diode laser device and of two spacing devices of the diode laser arrangement as per FIG. 1 in an oblique view.

FIG. 2 schematically illustrates the first cooling element 5, the diode laser device 3, the first spacing device 13.1 and the second spacing device 13.2 as per FIG. 1. FIG. 2 thus shows substantially the components of the diode laser arrangement 1 as per FIG. 1 without the second cooling element 9, which has been omitted in order to allow the components situated therebeneath to be more clearly seen. Identical and functionally identical elements are denoted by the same reference designations, such that, in this regard, reference is made to the description above.

The diode laser device 3 has a first diode main surface 15 which—from the viewer's point of view—is arranged on a bottom side of the diode laser device 3.

Furthermore, the diode laser device 3 has a second diode main surface 17 which—from the viewer's point of view—is arranged on a top side, situated opposite the bottom side, of the diode laser device 3. Here, the first diode main surface 15 and the second diode main surface 17 are arranged parallel to one another. The diode laser device 3 is arranged with the first diode main surface 15 on the first outer surface 7 in a first front region 23 thereof and with the second diode main surface 17 on the second outer surface 11 in a second front region 25 thereof.

In the exemplary embodiment as per FIG. 2, the first cooling element 5 has, in the first front region 23 of the first outer surface 7, a front intermediate element 31 which is of plate-like form and which is formed in particular as a submount. The diode laser device 3, in particular the diode laser bar 4, is arranged on the front intermediate element 31, on a top side from the viewer's point of view. The front intermediate element 31 is—from the viewer's point of view—arranged fixedly on a bottom side on a remaining part 35 of the first cooling element 5.

The front intermediate element 31 has, on its top side, an elevated surface section 37 on which the diode laser device 3 is arranged. The elevated surface section 37 is part of the first outer surface 7. The first outer surface 7 furthermore has a further surface section which is sunken in relation to the elevated surface section 37. As per FIG. 2, said further surface section is substantially assigned to the remaining part 35 of the first cooling element. In this exemplary embodiment, the first outer surface 7 thus has two surface sections which are arranged in a stepped manner in relation to one another, wherein the elevated surface section 37 and the further surface section lie parallel to one another.

The front intermediate element 31 is, as per FIG. 2, a separate component, which is in particular geometrically distinguishable with respect to the remaining part 35 and which is arranged fixedly on the remaining part 35. The front intermediate element 31 may however alternatively also be formed as a single piece with the remaining part 35.

The first cooling element 5 may optionally have further intermediate elements of the type discussed and/or the second cooling element 9 may have one or more intermediate elements of the type discussed, though this is not provided in the first exemplary embodiment of the diode laser arrangement 1.

The at least one spacing device 13, in this case the first spacing device 13.1 and the second spacing device 13.2, is/are configured to set a situation of the first cooling element 5 and of the second cooling element 9 relative to one another such that the first outer surface 7 is, in the first front region 23, in particular in the elevated surface section 37, arranged parallel to the first diode main surface 15, and/or that the second outer surface 11 is, in the second front region 25, arranged parallel to the second diode main surface 17. In particular, the first spacing device 13.1 is configured to set a spacing between the first outer surface 7 and the second outer surface 11 in the region of the first spacing device 13.1. In particular, the second spacing device 13.2 is analogously configured to set a spacing between the first outer surface 7 and the second outer surface 11 in the region of the second spacing device 13.2.

Figure 3:
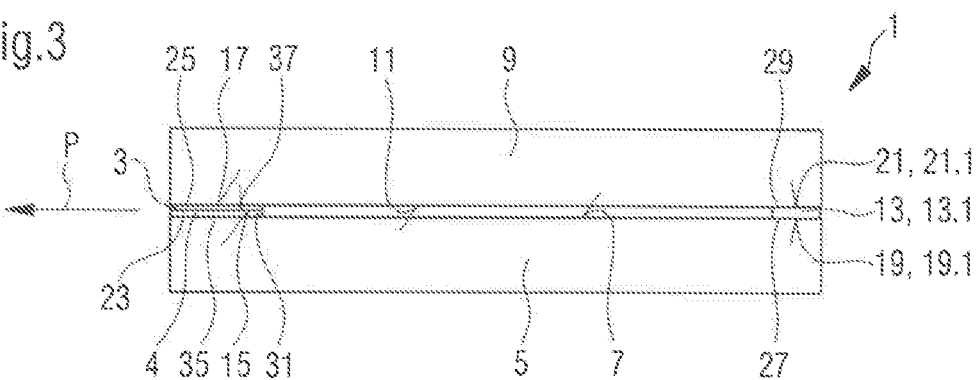
FIG. 3 is a schematic illustration of the diode laser arrangement as per FIG. 1 and FIG. 2 in a side view.

Optionally, as illustrated here, the first outer surface 7 and the second outer surface 11 are arranged parallel to one another or formed so as to be plane-parallel. Here, the first outer surface 7 has the two surface sections arranged in a stepped manner in relation to one another, specifically the elevated surface section 37 and the further surface section, which runs at least partially around the front intermediate element 31. The first outer surface 7, in particular the elevated surface section 37 and the further surface section, and also the second outer surface 11 are formed here so as to be plane-parallel. This is particularly clear from FIG. 3, which schematically shows the diode laser arrangement 1 as per FIGS. 1 and 2 in a side view. With reference to FIG. 3, identical and functionally identical elements are denoted by the same reference designations, such that, in this respect, reference is made to the description above.

The at least one spacing device 13 has a first contact surface 19, which is arranged on the first outer surface 7 or in a first rear region 27 of the first outer surface 7, and a second contact surface 21, which is arranged on the second outer surface 11 or in a second rear region 29 of the second outer surface 9. In the exemplary embodiment as per FIGS. 1, 2 and 3, the first contact surface 19 and the second contact surface 21 are in each case of two-part form, wherein each of the two spacing devices 13.1, 13.2 is assigned in each case one first contact surface 19.1, 19.2 and one second contact surface 21.1, 21.2.

Here, the first spacing device 13.1 has one such first contact surface 19.1. The second spacing device 13.2 has one such first contact surface 19.2. The first contact surfaces 19.1 and 19.2 are arranged in each case on the first outer surface 7 in the first rear region 27. The first spacing device 13.1 furthermore has a second contact surface 21.1 of the type discussed, which is situated opposite the first contact surface 19.1. The second spacing device 13.2 has a second contact surface 21.2 of the type discussed, which is situated opposite the first contact surface 19.2. The second contact surfaces 21.1 and 21.2 are arranged in each case on the second outer surface 11 in the second rear region 29. In the exemplary embodiment illustrated in FIGS. 1, 2 and 3, the first contact surface 19.1 and the second contact surface 21.1 are arranged parallel to one another, and the first contact surface 19.2 and the second contact surface 21.2 are arranged parallel to one another. In particular, here, the first contact surfaces 19.1, 19.2 and the second contact surfaces 21.1, 21.2 are in each case arranged parallel to one another.

Optionally, as is provided in the exemplary embodiment as per FIGS. 1, 2 and 3, the first contact surface 19, 19.1, 19.2 and/or the second contact surface 21, 21.1, 21.2 are/is in each case smaller than the first diode main surface 15 and/or the second diode main surface 17. Optionally, the first contact surface 19, 19.1, 19.2 and/or the second contact surface 21, 21.1, 21.2 are/is in each case smaller than $1/10$ of the first diode main surface 15 and/or $1/10$ of the second diode main surface 17.

Optionally, as is provided in the exemplary embodiment as per FIGS. 1, 2 and 3, the first contact surface 19, 19.1, 19.2 and the second contact surface 21, 21.1, 21.2 are/is in each case larger than $1/300$ of the first diode main surface 15 and larger than $1/300$ of the second diode main surface 17.

Figure 4:
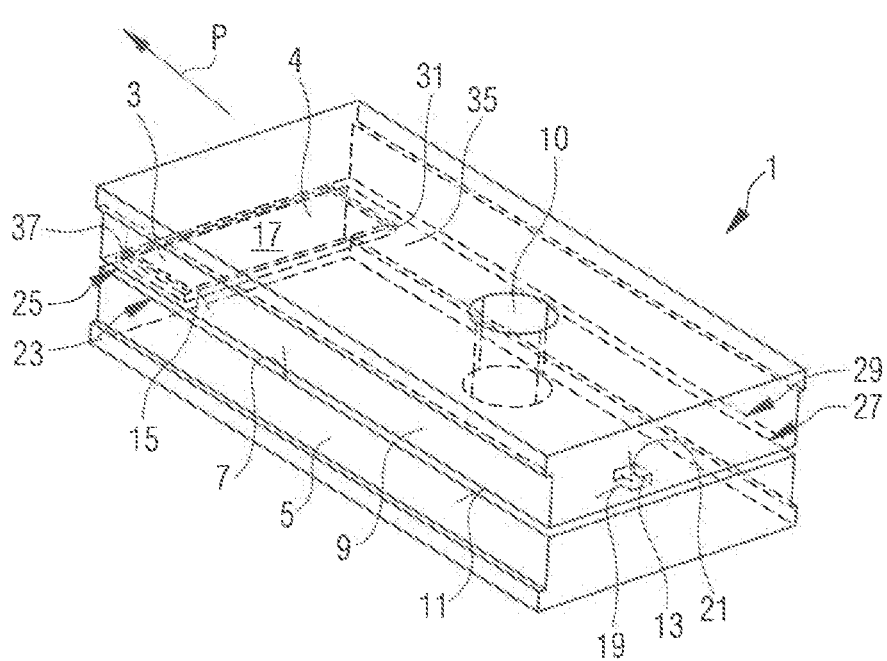
FIG. 4 is a schematic, transparent illustration of a second exemplary embodiment of the diode laser arrangement in an oblique view.

FIG. 4 illustrates a second exemplary embodiment of the diode laser arrangement 1 in schematically transparent form in an oblique view. Identical and functionally identical elements are denoted by the same reference designations, such that, in this regard, reference is made to the description above. The second exemplary embodiment of the diode laser arrangement 1 as per FIG. 4 differs substantially from the first exemplary embodiment as per FIGS. 1, 2 and 3 in that the diode laser arrangement 1 has exactly one spacing device 13, wherein the exactly one spacing device 13 is arranged centrally with respect to the diode laser device 3 and on an axis of symmetry of the diode laser device 3.

Figure 5:
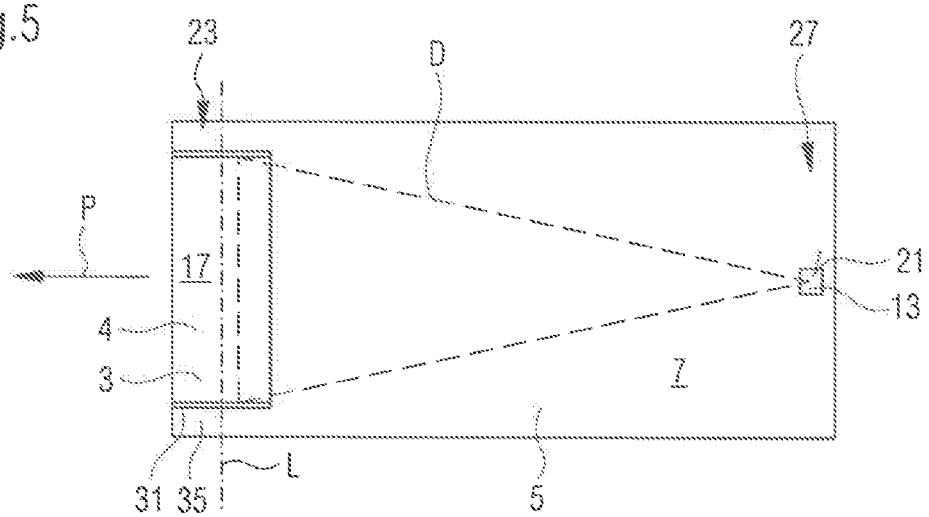
FIG. 5 is a schematic illustration of the first cooling element, of the diode laser device and of a spacing device of the diode laser arrangement as per FIG. 4 in a plan view.

FIG. 5 schematically shows the first cooling element 5, the diode laser device 3 and the exactly one spacing device 13 of the diode laser arrangement 1 as per FIG. 4 in a plan view. Identical and functionally identical elements are denoted by the same reference designations, such that, in this regard, reference is made to the description above. Here, the exactly one spacing device 13 is arranged centrally with respect to the diode laser device 3 and on an axis of symmetry of the diode laser device 3. Here, an orientation of said axis of symmetry corresponds to the laser radiation direction P. The diode laser device 3 has in this case a longitudinal axis L—lying in the plane of the image—which is arranged perpendicular to the laser radiation direction P. Here, the exactly one spacing device 13 lies substantially in a plane which is arranged perpendicular to the longitudinal axis L and which divides that section of the longitudinal axis L along which the diode laser device 3 extends into two parts of equal length. In particular, the diode laser device 3 forms, as it were, a base of an isosceles triangle, wherein the exactly one spacing device 13 forms the vertex, situated opposite said base, of the triangle. Such an isosceles triangle is illustrated by dashed lines in FIG. 5 and is denoted by the reference designation D.

In the exemplary embodiments illustrated in FIGS. 1 to 7, the at least one spacing device 13, 13.1, 13.2 is, by way of example, illustrated as a single piece as being substantially cuboidal. Here, as illustrated in the stated figures, the at least one spacing device 13, 13.1, 13.2 may in each case be a single spacer element. However, as will be discussed in more detail below, the at least one spacing device 13, 13.1, 13.2 may also be of some other form.

In particular, the at least one spacing device 13, 13.1, 13.2 is assigned at least one stack with at least one spacer element, preferably with multiple spacer elements, for setting the situation of the first cooling element 5 and of the second cooling element 9 relative to one another. In particular, here, the at least one spacer element is selected from a group composed of multiple at least partially differently dimensioned spacer elements.

Figure 8:
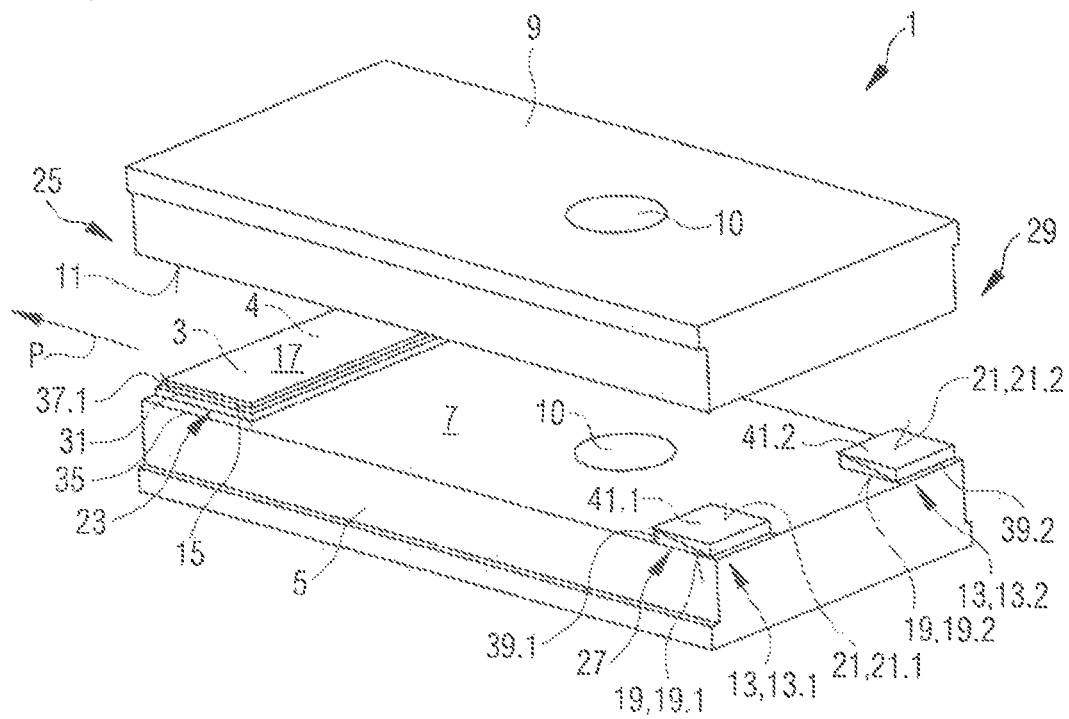
FIG. 8 is a schematic exploded illustration of a fourth exemplary embodiment of the diode laser arrangement in an oblique view.
Figure 9:
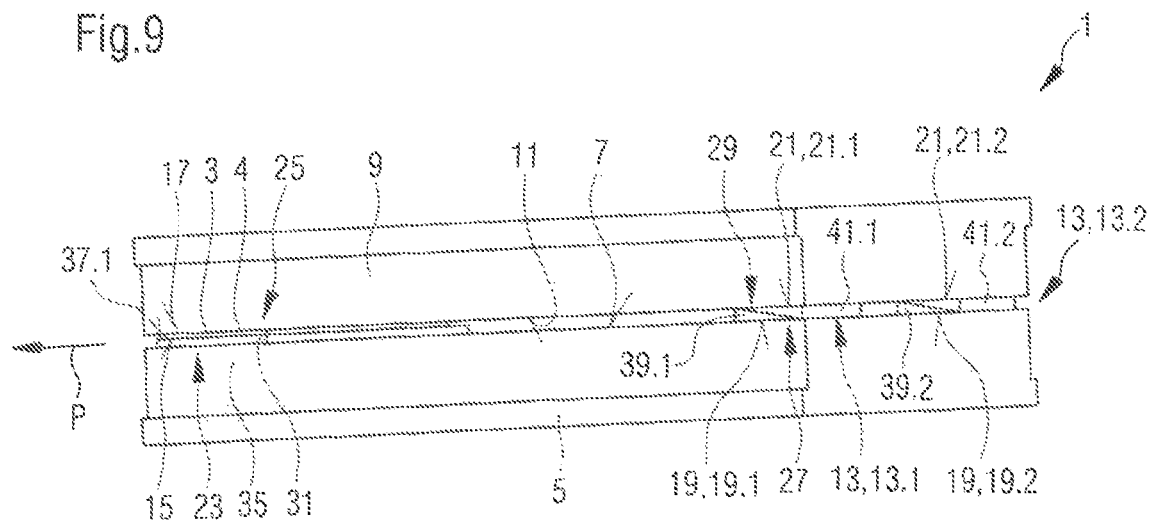
FIG. 9 is a schematic illustration of the diode laser arrangement as per FIG. 8 in a side view.

Optionally, the at least one spacing device 13, 13.1, 13.2 has at least one wedge-shaped spacer element which is displaceable relative to the first cooling element 5 and/or the second cooling element 9. Such a configuration is illustrated in FIGS. 8 and 9.

Figure 10:
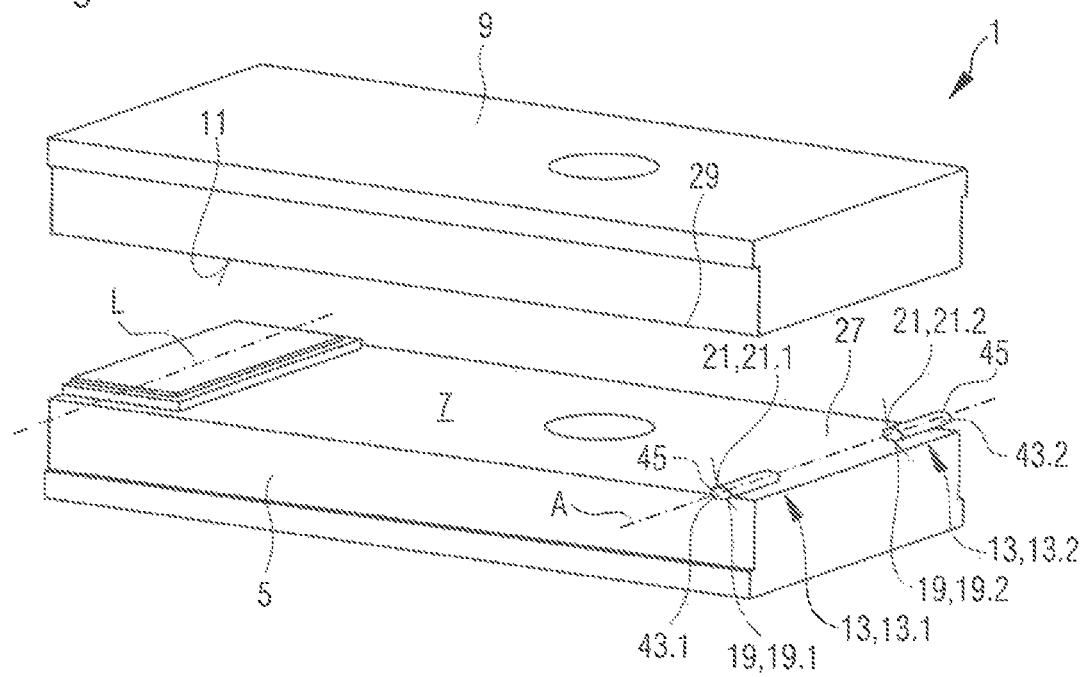
FIG. 10 is a schematic exploded illustration of a fifth exemplary embodiment of the diode laser arrangement in an oblique view.
Figure 11:
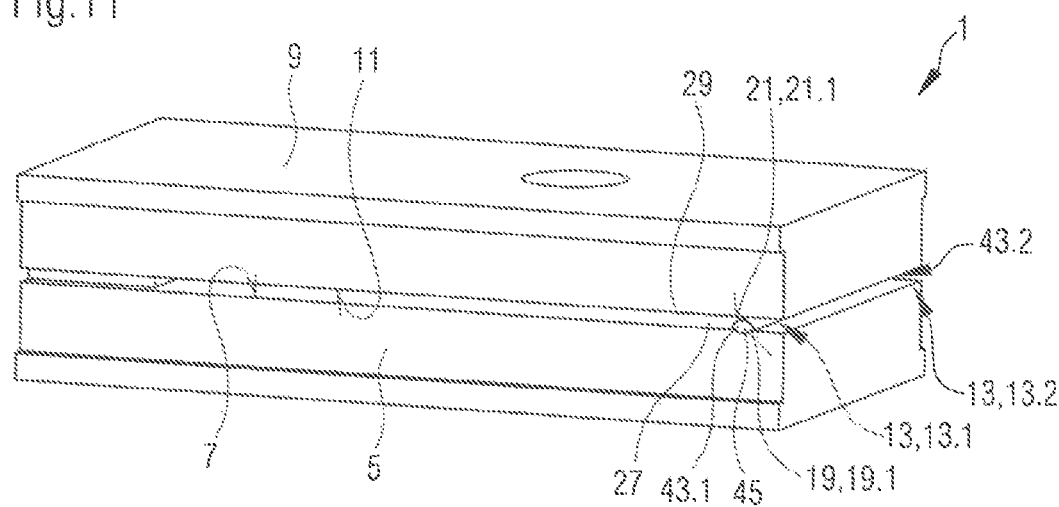
FIG. 11 is a schematic illustration of the diode laser arrangement as per FIG. 10 in an oblique view.

Optionally, the at least one spacing device 13, 13.1, 13.2 has a spacer element of oval form, wherein the situation of the first cooling element 5 and of the second cooling element 9 relative to one another is settable by rotation of the spacer element of oval form. Such a configuration is illustrated in FIGS. 10 and 11.

Optionally, the at least one spacing device 13, 13.1, 13.2 is at least partially of plastically deformable form.

Optionally, the first cooling element 5 is of plastically deformable form in a region situated opposite the first contact surface 19, 19.1, 19.2 and/or the second cooling element 9 is of plastically deformable form in a region situated opposite the second contact surface 21, 21.1, 21.2.

Optionally, the situation of the first cooling element 5 and of the second cooling element 9 relative to one another, set by means of the at least one spacing device 13, 13.1, 13.2, is fixedly set after initial assembly of the diode laser arrangement 1.

Optionally, the at least one spacing device 13, 13.1, 13.2 is configured to provide electrical insulation between the first cooling element 5 and the second cooling element 9. Furthermore, the at least one spacing device 13, 13.1, 13.2 is optionally configured to absorb and/or transmit pressure forces transmitted via the first cooling element 5 and/or the second cooling element 9.

Optionally, the diode laser device 3 is arranged on the first outer surface 7 in the first front region 23 of the first outer surface 7 at a front edge—with respect to the laser radiation direction P—of said first outer surface and on the second outer surface 11 in the first front region 25 of the second outer surface 11 at a front edge—with respect to the laser radiation direction P—of said second outer surface.

Optionally, the at least one spacing device 13, 13.1, 13.2 is arranged on the first outer surface 7 in the first rear region 27, situated opposite the first front region 23, of the first outer surface 7, in particular—as illustrated in FIGS. 1 to 3—at a rear edge—with respect to the laser radiation direction P—of said first outer surface. Optionally, the at least one spacing device 13, 13.1, 13.2 is arranged on the second outer surface 11 in the second rear region 29, situated opposite the second front region 25, of the second outer surface 11, in particular—as illustrated in FIGS. 1 to 3—at a rear edge—with respect to the laser radiation direction P—of said second outer surface.

Optionally, in the case of a diode laser arrangement 1 with two spacing devices 13.1, 13.2—as per FIGS. 1 to 3 and 6 to 11—the first spacing device 13.1 is arranged in each case in a first corner region of the first rear region 27 and of the second rear region 29, wherein the second spacing device 13.2 is arranged in each case in a second corner region, situated opposite the first corner region, of the first rear region 27 and of the second rear region 29.

FIG. 6 schematically illustrates a third exemplary embodiment of the diode laser arrangement 1 in an oblique exploded view. Identical and functionally identical elements are denoted by the same reference designations, such that, in this regard, reference is made to the description above. The first cooling element 5 has, in the first front region 23 of the first outer surface 7, a front intermediate element 31 of the type already discussed. The diode laser device 3, in particular the diode laser bar 4, is arranged on the front intermediate element 31, on the top side. The front intermediate element 31 is arranged on the bottom side on the remaining part 35 of the first cooling element 5.

The first cooling element 5 has, in the first rear region 27 of the first outer surface 7, a rear intermediate element 33. Here, the rear intermediate element 33 is of identical form to the front intermediate element 31. In particular, the rear intermediate element 33 is of identical form, with regard to its dimensions, to the front intermediate element 31. The first spacing device 13.1 and the second spacing device 13.2 are arranged in each case on the rear intermediate element 33, on a top side from the viewer's point of view. The rear intermediate element 33 is—from the viewer's point of view—arranged on a bottom side on the remaining part 35 of the first cooling element 5.

The front intermediate element 31 and the rear intermediate element 33 are, as per FIG. 6, separate components, which are in particular geometrically distinguishable with respect to the remaining part 35 and which are in each case arranged fixedly on the remaining part 35 of the first cooling element 5. The two intermediate elements 31, 33 may however alternatively also be formed as a single piece with the remaining part 35.

Optionally, the second cooling element 9 may have one or more intermediate elements of the discussed type, which is however not illustrated in the figures. In particular, it is possible for the diode laser device 3 to be arranged between a first front intermediate element 31 and a second front intermediate element, and/or for the at least one spacing device 13 to be arranged between a first rear intermediate element 33 and a second rear intermediate element.

FIG. 7 schematically illustrates the third exemplary embodiment of the diode laser arrangement 1 as per FIG. 6 in a side view. Identical and functionally identical elements are denoted by the same reference designations, such that, in this regard, reference is made to the description above.

FIG. 8 schematically illustrates a fourth exemplary embodiment of the diode laser arrangement 1 in an oblique exploded view. Identical and functionally identical elements are denoted by the same reference designations, such that, in this regard, reference is made to the description above. Here, the first cooling element 5 has a front intermediate element 31 of the type discussed. Here, however, a rear intermediate element 33 is not provided.

Here, the diode laser arrangement 1 has two spacing devices 13, specifically a first spacing device 13.1 and a second spacing device 13.2. The first spacing device 13.1 and the second spacing device 13.2 have in each case a first wedge-shaped spacer element 39.1, 39.2 and a second wedge-shaped spacer element 41.1, 41.2. At least one, in particular two, of the wedge-shaped spacer elements 39.1, 39.2, 41.1, 41.2, preferably the first wedge-shaped spacer elements 39.1, 39.2 or the second wedge-shaped spacer elements 41.1, 41.2, are/is displaceable relative to the first cooling element 5 and/or the second cooling element 9 during initial assembly of the diode laser arrangement 1 in order to set the situation of the first cooling element 5 and of the second cooling element 9 relative to one another. In particular, here, the first wedge-shaped spacer elements 39.1, 39.2 and/or the second wedge-shaped spacer elements 41.1, 41.2 are displaceable in the direction of the diode laser device 3 or in the opposite direction, in particular along the laser radiation direction P.

The first wedge-shaped spacer elements 39.1, 39.2 have in each case one first contact surface 19.1, 19.2 in the manner of the first contact surface 19 already discussed. The second wedge-shaped spacer elements 41.1, 41.2 have in each case one second contact surface 21.1, 21.2 in the manner of the second contact surface 21 already discussed.

The first wedge-shaped spacer element 39.1, 39.2 and the second wedge-shaped spacer element 41.1, 41.2 are in this case situated in each case mirror-symmetrically one above the other. If the first wedge-shaped spacer element 39.1, 39.2 and/or the second wedge-shaped spacer element 41.1, 41.2 are, in each case during initial assembly of the diode laser arrangement 1, displaced relative to one another, in particular slid one over the other, in mutually opposite directions, such that the first cooling element 5 and the second cooling element 9 are pushed apart, a spacing between the first outer surface 7 in the first rear region 27 and the second outer surface 11 in the second rear region 29 is increased. Analogously, by displacement in the reverse direction, a spacing between the first outer surface 7 in the first rear region 27 and the second outer surface 11 in the second rear region 29 is reduced. By means of such setting of the spacing between the first outer surface 7 in the first rear region 27 and the second outer surface 11 in the second rear region 29, the situation of the first cooling element 5 and of the second cooling element 9 relative to one another can be set during initial assembly of the diode laser arrangement 1. By means of the two spacing devices 13.1, 13.2, such a spacing between the two outer surfaces 7, 11 can be set in each case in two different regions.

Alternatively, the wedge-shaped spacer elements 39.1, 39.2, 41.1, 41.2 may also have some other form which is suitable for the setting of a situation of the first cooling element 5 and of the second cooling element 9 relative to one another in the described manner.

In particular, after initial assembly of the diode laser arrangement 1, the first wedge-shaped spacer elements 39.1, 39.2 and the second wedge-shaped spacer elements 41.1, 41.2 are in each case fixedly connected to one another in a relative position in which the situation of the first cooling element 5 and of the second cooling element 9 relative to one another has been set as intended.

Alternatively or in addition, in particular after initial assembly of the diode laser arrangement 1, in the case of the situation of the first cooling element 5 and of the second cooling element 9 relative to one another having been set as intended, the first wedge-shaped spacer element 39.1 and/or the second wedge-shaped spacer element 41.1 and/or the first wedge-shaped spacer element 39.2 and/or the second wedge-shaped spacer element 41.2 are/is fixedly connected to the first cooling element 5 and/or to the second cooling element 9.

Optionally, the diode laser arrangement 1 has exactly one spacing device 13 or more than two spacing devices 13, which is/are formed analogously to the first spacing device 13.1 and/or to the second spacing device 13.2. Such embodiments are however not illustrated in the figures.

Optionally, the diode laser arrangement 1 has at least one spacing device 13 which has exactly one wedge-shaped spacer element which, during initial assembly of the diode laser arrangement 1, is displaceable relative to the first cooling element 5 and/or the second cooling element 9. In particular, said wedge-shaped spacer element is in this case slidable between the first outer surface 7 in the first rear region 27 and the second outer surface 11 in the second rear region 29. A spacing between the first outer surface 7 and the second outer surface 11, in particular a situation of the first cooling element 5 and of the second cooling element 9 relative to one another, is set in particular in a manner dependent on the extent to which the wedge-shaped spacer element is slid between the first outer surface 7 and the second outer surface 11 and thus the first cooling element 5 and the second cooling element 9 are pushed apart. In particular, said wedge-shaped spacer element is fixedly connected to the first cooling element 5 and/or to the second cooling element 9 in a position in which the situation of the first cooling element 5 and of the second cooling element 9 relative to one another has been set as intended. Such an embodiment is however not illustrated in the figures.

FIG. 9 schematically illustrates the fourth exemplary embodiment of the diode laser arrangement 1 as per FIG. 8 in a side view. Identical and functionally identical elements are denoted by the same reference designations, such that, in this regard, reference is made to the description above.

FIG. 10 schematically illustrates a fifth exemplary embodiment of the diode laser arrangement 1 in an oblique exploded view. Identical and functionally identical elements are denoted by the same reference designations, such that, in this regard, reference is made to the description above. The diode laser arrangement 1 has two spacing devices 13.1, 13.2 which each have a spacer element 43.1, 43.2 which is of oval form as viewed in cross section. The spacer elements of oval form are in each case of substantially rod-shaped form.

The spacer element 43.1 of oval form of the first spacing device 13.1 lies with a first contact surface 19.1 against the first outer surface 7 in the first rear region 27. Likewise, the spacer element 43.1 of oval form lies with a second contact surface 21.1 against the second outer surface 11 in the second rear region 29. Here, the first contact surface 19.1 and the second contact surface 21.1 are, in a manner dependent on an angle of rotation of the spacer element 43.1 of oval form about an axis of rotation A, which in this case runs parallel to the longitudinal axis L, is arranged in each case in a region on a lateral surface of the spacer element 43.1 of oval form. The first contact surface 19.2 and the second contact surface 21.2 of the spacer element 43.2 of oval form of the second spacing device 13.2 are configured or arranged analogously to the first spacing device 13.1. An axis of rotation A of the spacer element 43.2 of oval form is in this case identical to the axis of rotation A of the spacer element 43.1 of oval form. The axes of rotation A of the spacer elements 43.1, 43.2 of oval form may however also be oriented differently, for example perpendicular to the longitudinal axis L.

The situation of the first cooling element 5 and of the second cooling element 9 relative to one another can be set by rotation of the spacer elements 43.1 and 43.2 of oval form, wherein, here, the spacer elements 43.1 and 43.2 of oval form are in each case settable separately, in particular independently of one another. Alternatively, the two spacer elements 43.1 and 43.2 of oval form may also be settable synchronously. Depending on the respective angle of rotation of the spacer elements 43.1, 43.2 of oval form with respect to the axis of rotation A, a respective spacing between the first cooling element 5 and the second cooling element 9 in the region of the spacer elements 43.1, 43.2 of oval form is set.

In this exemplary embodiment, the spacer elements 43.1 and 43.2 of oval form project laterally in each case beyond the first outer surface 7 and the second outer surface 11 respectively, and form in each case one projection 45 there. By means of the projection 45, a rotation of the spacer elements 43.1, 43.2 of oval form can be performed in a simple manner, in particular by means of a suitable apparatus.

After initial assembly of the diode laser arrangement 1, a rotational angle situation of the spacer elements 43.1, 43.2 of oval form with respect to the axis of rotation A relative to the first cooling element 5 and/or the second cooling element 9, in the case of which the situation of the first cooling element 5 and of the second cooling element 9 relative to one another has been set as intended, is in each case fixed. In particular, the spacer elements 43.1, 43.2 of oval form are then in each case fixedly connected to the first cooling element 5 and/or the second cooling element 9. In particular, a situation of the first cooling element 5 and of the second cooling element 9 relative to one another which has been set as intended is thus fixedly set after initial assembly of the diode laser arrangement 1.

It is alternatively provided—but not illustrated in FIGS. 10 and 11—that the diode laser arrangement 1 has exactly one spacing device 13 which has a spacer element 43.1, 43.2 of oval form—as viewed in cross section—of the type discussed. Said spacer element may for example extend along the axis of rotation A. Alternatively, the spacer element 43.1, 43.2 of oval form may—analogously to the spacing device 13 as per FIGS. 4 and 5—be arranged centrally, wherein a corresponding axis of rotation is oriented for example perpendicular to the longitudinal axis L.

Alternatively, a spacer element 43.1, 43.2 of the type discussed may also have a cross section which differs from an oval cross section and which is suitable for setting a situation of the first cooling element 5 and of the second cooling element 9.

FIG. 11 schematically illustrates the fifth exemplary embodiment of the diode laser arrangement 1 as per FIG. 10 in an oblique view. Identical and functionally identical elements are denoted by the same reference designations, such that, in this regard, reference is made to the description above.

A method for assembling a diode laser arrangement 1, in particular a diode laser arrangement 1 according to any of the exemplary embodiments described above, will be described below. Here, a diode laser device 3 and at least one spacing device 13, 13.1, 13.2 are arranged, spaced apart from one another, in each case between a first cooling element 5, which is configured for cooling the diode laser device 3, and a second cooling element 9, which is configured for cooling the diode laser device 3. The diode laser device 3 and the at least one spacing device 13, 13.1, 13.2 are arranged in each case on a first outer surface 7 of the first cooling element 5 and on a second outer surface 11 of the second cooling element 9. The diode laser device 3 is arranged with a first diode main surface 15 on the first outer surface 7 in a first front region 23 thereof and/or with a second diode main surface 17 on the second outer surface 11 in a second front region 25 thereof. By means of the at least one spacing device 13, 13.1, 13.2, a situation of the first cooling element 5 and of the second cooling element 9 relative to one another is set such that the first outer surface 7 is, in the first front region 23, arranged parallel to the first diode main surface 15, and/or that the second outer surface 11 is, in the second front region 25, arranged parallel to the second diode main surface 17.

Altogether, it is evident that, by means of the diode laser arrangement 1 and the method for assembling a diode laser arrangement 1, an increased dissipation of heat from the diode laser device 3 can be reliably realized, whereby the output power of the diode laser device 3 is significantly increased.

The invention claimed is:

1. A diode laser arrangement, comprising:
   a diode laser device having a first diode main surface and a second diode main surface;
   a first cooling element having a first outer surface with a first front region;
   a second cooling element having a second outer surface with a second front region;
   at least one spacing device;
   said diode laser device and said at least one spacing device being mutually spaced apart between said first cooling element and said second cooling element;
   said diode laser device and said at least one spacing device being disposed on said first outer surface and on said second outer surface;
   said first cooling element and said second cooling element being configured to cool said diode laser device;
   said diode laser device having at least one of said first diode main surface disposed on said first front region of said first outer surface or said second diode main surface disposed on said second front region of said second outer surface;
   said at least one spacing device configured to orient said first cooling element and said second cooling element relative to one another to place at least one of said first front region of said first outer surface parallel to said first diode main surface or said second front region of said second outer surface parallel to said second diode main surface;
   said at least one spacing device having a first contact surface disposed on said first outer surface and a second contact surface disposed on said second outer surface; and
   at least one of said first contact surface being smaller than 1/10 of said first diode main surface or said second contact surface being smaller than 1/10 of said second diode main surface.

2. The diode laser arrangement according to claim 1, wherein said first outer surface and said second outer surface are disposed parallel to one another, at least in certain regions.

3. The diode laser arrangement according to claim 1, wherein said at least one spacing device includes a stack of at least one spacer element for orienting said first cooling element and said second cooling element relative to one another, said at least one spacer element being selected from a group composed of multiple at least partially differently dimensioned spacer elements.

4. The diode laser arrangement according to claim 1, wherein said at least one spacing device has at least one wedge-shaped spacer element being displaceable relative to at least one of said first cooling element or said second cooling element.

5. The diode laser arrangement according to claim 1, wherein said at least one spacing device has a spacer element with an oval shape, and said oval spacer element is rotatable for setting an orientation of said first cooling element and said second cooling element relative to one another.

6. The diode laser arrangement according to claim 1, wherein said at least one spacing device is at least partially plastically deformable.

7. The diode laser arrangement according to claim 1, wherein at least one of:
   said first cooling element is plastically deformable in a region opposite said first contact surface, or
   said second cooling element is plastically deformable in a region opposite said second contact surface.

8. The diode laser arrangement according to claim 1, wherein an orientation of said first cooling element and said second cooling element relative to one another is set by said at least one spacing device and is fixedly set after a first step of assembly of the diode laser arrangement.

9. The diode laser arrangement according to claim 1, wherein said at least one spacing device is configured to at least one of:
   provide electrical insulation between said first cooling element and said second cooling element, or
   at least one of absorb or transmit pressure forces transmitted by at least one of said first cooling element or said second cooling element.

10. The diode laser arrangement according to claim 1, wherein:
    said first outer surface has a first rear region disposed opposite to said first front region;
    said second outer surface has a second rear region disposed opposite to said second front region; and
    said at least one spacing device is disposed in said first rear region and in said second rear region.

11. The diode laser arrangement according to claim 1, wherein said at least one spacing device is exactly one spacing device, and said exactly one spacing device is disposed at least one of centrally relative to said diode laser device or on an axis of symmetry of said diode laser device.

12. The diode laser arrangement according to claim 1, wherein said at least one spacing device includes two spacing devices spaced apart from one another.

13. A diode laser arrangement, comprising:
    a diode laser device having a first diode main surface and a second diode main surface;
    a first cooling element having a first outer surface with a first front region;
    a second cooling element having a second outer surface with a second front region;
    at least one spacing device;
    said diode laser device and said at least one spacing device being mutually spaced apart between said first cooling element and said second cooling element;
    said diode laser device and said at least one spacing device being disposed on said first outer surface and on said second outer surface;
    said first cooling element and said second cooling element being configured to cool said diode laser device;
    said diode laser device having at least one of said first diode main surface disposed on said first front region of said first outer surface or said second diode main surface disposed on said second front region of said second outer surface;
    said at least one spacing device configured to orient said first cooling element and said second cooling element relative to one another to place at least one of said first front region of said first outer surface parallel to said first diode main surface or said second front region of said second outer surface parallel to said second diode main surface;
    said at least one spacing device having a first contact surface disposed on said first outer surface and a second contact surface disposed on said second outer surface;
    at least one of said first contact surface being smaller than said first diode main surface or said second contact surface being smaller than said second diode main surface; and
    at least one of said first contact surface being larger than $\frac{1}{300}$ of said first diode main surface or said second contact surface being a larger than $\frac{1}{300}$ of said second diode main surface.

14. A method for assembling a diode laser arrangement, the method comprising:
    spacing a diode laser device and at least one spacing device apart from one another between a first cooling element configured for cooling the diode laser device and a second cooling element configured for cooling the diode laser device;
    placing the diode laser device and the at least one spacing device, on a first outer surface of the first cooling element and on a second outer surface of the second cooling element;
    placing at least one of a first diode main surface of the diode laser device in a first front region of the first outer surface or a second diode main surface in a second front region of the second outer surface; and
    using the at least one spacing device to orient the first cooling element and the second cooling element relative to one another and to place at least one of the first outer surface parallel to the first diode main surface in the first front region or the second outer surface parallel to the second diode main surface in the second front region;
    providing the at least one spacing device with a first contact surface disposed on the first outer surface and a second contact surface disposed on the second outer surface; and
    configuring at least one of the first contact surface to be smaller than $\frac{1}{10}$ of the first diode main surface or the second contact surface to be smaller than $\frac{1}{10}$ of the second diode main surface or
    at least one of said first contact surface being smaller than said first diode main surface or said second contact surface being smaller than said second diode main surface while configuring at least one of the first contact surface to be larger than $\frac{1}{300}$ of the first diode main surface or the second contact surface to be larger than $\frac{1}{300}$ of the second diode main surface.

* * * * *